(12) United States Patent
Jacobsen et al.

(10) Patent No.: US 7,626,123 B2
(45) Date of Patent: Dec. 1, 2009

(54) ELECTRICAL MICROFILAMENT TO CIRCUIT INTERFACE

(75) Inventors: Stephen C. Jacobsen, Salt Lake City, UT (US); David P. Marceau, Salt Lake City, UT (US); Shayne M. Zurn, Salt Lake City, UT (US); David T. Markus, Salt Lake City, UT (US)

(73) Assignee: Raytheon Sarcos, LLC, Waltham, MA (US)

( * ) Notice: Subject to any disclaimer, the term of this patent is extended or adjusted under 35 U.S.C. 154(b) by 78 days.

(21) Appl. No.: 11/637,380

(22) Filed: Dec. 11, 2006

(65) Prior Publication Data

US 2007/0132109 A1    Jun. 14, 2007

Related U.S. Application Data (60) Provisional application No. 60/749,873, filed on Dec. 12, 2005, provisional application No. 60/749,777, filed on Dec. 12, 2005.

(51) Int. Cl.
*H01B 5/00* (2006.01)
*H01B 7/08* (2006.01)
*H05K 1/11* (2006.01)

(52) U.S. Cl. ............ 174/128.1; 174/128.2; 174/113 C; 174/131 A; 174/254; 257/666; 257/678; 257/686; 257/E23.067; 257/E23.079

(58) Field of Classification Search ............ 174/128.1, 174/128.2, 113 C, 131 A; 257/666, 678, 257/686
See application file for complete search history.

(56) References Cited

U.S. PATENT DOCUMENTS 3,337,838 A    8/1967    Damiano et al.
3,601,759 A    8/1971    Barker
4,132,461 A    1/1979    Jaques
4,203,650 A    5/1980    Millet et al.
4,369,104 A    1/1983    Beckley
5,599,615 A    2/1997    Swift et al.

(Continued)

FOREIGN PATENT DOCUMENTS

GB    2039421    8/1980

(Continued)

OTHER PUBLICATIONS

Brunsting et al. "Enhanced optical performance for small form factor LC connectors": Panduit Corp., pp. 1-5.

(Continued)

*Primary Examiner*—Dao H Nguyen
(74) *Attorney, Agent, or Firm*—Thorpe North & Western LLP (57) ABSTRACT

Devices and methods for electrical interconnection for microelectronic circuits are disclosed. One method of electrical interconnection includes forming a bundle of microfilaments, wherein at least two of the microfilaments include electrically conductive portions extending along their lengths. The method can also include bonding the microfilaments to corresponding bond pads of a microelectronic circuit substrate to form electrical connections between the electrically conductive portions and the corresponding bond pads. A microelectronic circuit can include a bundle of microfilaments bonded to corresponding bond pads to make electrical connection between corresponding bonds pads and electrically-conductive portions of the microfilaments.

33 Claims, 6 Drawing Sheets

U.S. PATENT DOCUMENTS

| | | | |
|---|---|---|---|
| 5,610,747 | A | 3/1997 | Jacobsen |
| 5,861,662 | A | 1/1999 | Candelore |
| 6,020,747 | A | 2/2000 | Bahns et al. |
| 6,110,354 | A | 8/2000 | Sayan et al. |
| 6,128,527 | A | 10/2000 | Howard, III et al. |
| 6,289,187 | B1 | 9/2001 | Swift et al. |
| 6,330,466 | B1 | 12/2001 | Hofmann et al. |
| 6,334,856 | B1 | 1/2002 | Allen et al. |
| 6,444,102 | B1 | 9/2002 | Tucci et al. |
| 6,462,398 | B1 | 10/2002 | Jojiki |
| 6,515,346 | B1 | 2/2003 | Kemeny |
| 6,740,214 | B1 | 5/2004 | Dobson et al. |
| 6,794,984 | B2 | 9/2004 | Koatsu |
| 6,829,498 | B2 | 12/2004 | Kipke et al. |
| 6,851,980 | B2 | 2/2005 | Nelson et al. |
| 6,892,438 | B1 | 5/2005 | Hill et al. |
| 6,924,439 | B1 * | 8/2005 | Bonni et al. ................ 174/254 |
| 6,946,851 | B2 | 9/2005 | Lee et al. |
| 6,953,347 | B2 | 10/2005 | McGrath et al. |
| 6,993,392 | B2 | 1/2006 | Nicolelis et al. |
| 7,010,356 | B2 | 3/2006 | Jog et al. |
| 7,333,699 | B2 | 2/2008 | Jacobsen et al. |
| 7,550,677 | B2 * | 6/2009 | Debladis et al. .......... 174/128.1 |
| 2004/0080056 | A1 | 4/2004 | Lim et al. |
| 2004/0125515 | A1 | 7/2004 | Popovich |
| 2005/0029009 | A1 | 2/2005 | Swift |
| 2005/0029646 | A1 | 2/2005 | Ueda et al. |
| 2005/0143790 | A1 | 6/2005 | Kipke |
| 2005/0159028 | A1 | 7/2005 | Sweetland |
| 2005/0202695 | A1 | 9/2005 | Sweetland |
| 2005/0230795 | A1 * | 10/2005 | Furuyama et al. ........... 257/678 |
| 2006/0039660 | A1 | 2/2006 | Henze |
| 2007/0142714 | A1 | 6/2007 | Shumate |

FOREIGN PATENT DOCUMENTS

| | | |
|---|---|---|
| JP | 2004237077 | 8/2004 |

OTHER PUBLICATIONS

Hayes, Jim "Connector types and terminology": Power and Integrated Building Systems, Editorial, pp. 1-2, 2005.

Allan, "Twist-pin concept increases miniature connector reliability" Electronic Design, The authority on emerging technologies for desing solutions freescale.com pp. 1-2, 2002.

Bell, "Carpenter breaks barrier with nano-miniature connector specification", Mar. 9, 2005, pp. 1-3. Columbus Federal Voice.

Z-Axis Connector Company "Miniature Electronic Connectors": pp. 1-11.

Glenair "MIL-DTL-32139 Nanominiature Connectors Single row metal shell pigtails (M32139.01 & 02)": www.glenair.com, 2005, pp. 1-2.

Nano Line—NJS Microminiature, ITT Industries, www.ittcannon.com, p. L-14.

Nano Line—Strip-NT Microminiature, ITT Industries, www.ittcannon.com, p. L-15.

Patterson, William et al. "A microelectrode/microelectronic hybrid device for for brain implantable neuroprosthesis applications": IEEE, Oct. 2004, pp. 1845-1853, vol. 51, No. 10.

Normann, "Sight restoration for individuals with profound blindness", www.bioen.utah.edu/cni/projects/blindess.htm, Sep. 21, 2005, pp. 1-21.

Jacobsen, U.S. Appl. No. 12/070,580, filed Feb. 19, 2008.

Jacobsen, U.S. Appl. No. 11/637,508, filed Dec. 11, 2006.

"LSI Announces Wire-Bond Advance" pp. 1-2.

Brunner et at., "Advanced wire bond looping technology for emerging packages", SEMI Technical Symposium; Innovations in Semiconductor Manufacturing, 2004, pp. 1-8.

Karnezos et al. 3D Packaging Promises Perfomance, reliabilyt Gains with Small Footprints and Lower Porfiles, www.cipscalereview.com, Feb. 2005, pp. 1-6.

Chylak et al. "Overcoing the key barriers in 35 umPitch wire bond packaging: probe, mold, and substrate solutions and trade-offs" SEMI/IEEE, 2002, pp. 1-6.

ESEC "25um fine pitch solution", 2002, pp. 1-3.

ASE Kaohsiung, "CSP Leadless LGA", pp. 1-5, 2005.

* cited by examiner

FIG. 14 ed today includes electronic circuitry. For example, micro-

ELECTRICAL MICROFILAMENT TO CIRCUIT INTERFACE

This patent claims the benefit of U.S. Provisional Patent Application Ser. No. 60/749,777 filed Dec. 12, 2005, entitled "Ultra-High Density Electrical Connector" and U.S. Provisional Patent Application Ser. No. 60/749,873, filed Dec. 12, 2005 entitled "Multi-Element Probe Array," each of which is incorporated by reference.

BACKGROUND OF THE INVENTION AND RELATED ART

Sometimes it seems as if almost every device manufactured today includes electronic circuitry. For example, microprocessors are present in a wide array of products, including such disparate items as high-end computer systems, body-implantable medical systems, kitchen toasters, and simple children toys.

For many electronic systems, achieving small size is highly desired. Accordingly, numerous advancements in the miniaturization of electronic systems have been achieved over the last few decades. Microelectronic circuits, including for example silicon integrated circuits, have become ubiquitous. Integrated circuits are miniature electronic circuits manufactured on a thin substrate of semiconductor material. Typically, multiple circuits are manufactured on a single semiconductor wafer, and the individual circuits are then separated into what is referred to as a chip or die. Die sizes vary widely, although die sizes of about 5 mm to 15 mm per edge are common. The die is typically placed into a package, and small wires are connected between the lead frame of the package and bond pads on the semiconductor die.

The scale of wires and bonding pads used in semiconductors is relatively small. For example, a typical bond pad is a square pad of about 35 micrometer to 50 micrometer on a side. Connection between the bond pad and leads of the device is via 15-micrometer diameter bond wires that are ultrasonically bonded to the bond pad and a lead-connecting portion of a lead frame. Unfortunately, even at these sizes, the space taken up by the bond pads has become a limiting factor in some chip designs. For example, one-tenth of the available semiconductor area can be lost to bond pads. Providing higher density interconnect between the semiconductor die and the package has proven challenging, and typically bond pads are limited to rows of two pads on each side of the die due to the wire bond geometry.

The use of multiple die in a single package is also becoming more common. Interconnect requirements are accordingly increased, as wire bonding between die and from die to package are both required.

Accordingly, there is a need for new interconnection technology that can provide significant improvements in interconnection density.

SUMMARY OF THE INVENTION

The present invention includes a method of electrical interconnection for microelectronic circuits that helps to overcome problems and deficiencies inherent in the prior art. In one embodiment, the method includes forming a bundle of microfilaments, wherein at least two of the microfilaments include an electrically-conductive portion extending along their lengths. The microfilaments are bonded to a microelectronic circuit substrate so that electrical connections are formed between the electrically-conductive portions and corresponding bond pads on the microelectronic circuit substrate.

BRIEF DESCRIPTION OF THE DRAWINGS

The present invention will become more fully apparent from the following description and appended claims, taken in conjunction with the accompanying drawings. Understanding that these drawings merely depict exemplary embodiments of the present invention they are, therefore, not to be considered limiting of its scope. It will be readily appreciated that the components of the present invention, as generally described and illustrated in the figures herein, can be arranged and designed in a wide variety of different configurations. Nonetheless, the invention will be described and explained with additional specificity and detail through the use of the accompanying drawings in which:

DETAILED DESCRIPTION OF EXEMPLARY EMBODIMENTS

The following detailed description of exemplary embodiments of the invention makes reference to the accompanying drawings, which form a part hereof and in which are shown, by way of illustration, exemplary embodiments in which the invention may be practiced. While these exemplary embodiments are described in sufficient detail to enable those skilled in the art practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

The following detailed description and exemplary embodiments of the invention will be best understood by reference to the accompanying drawings, wherein the elements and features of the invention are designated by numerals throughout.

Figure 1:
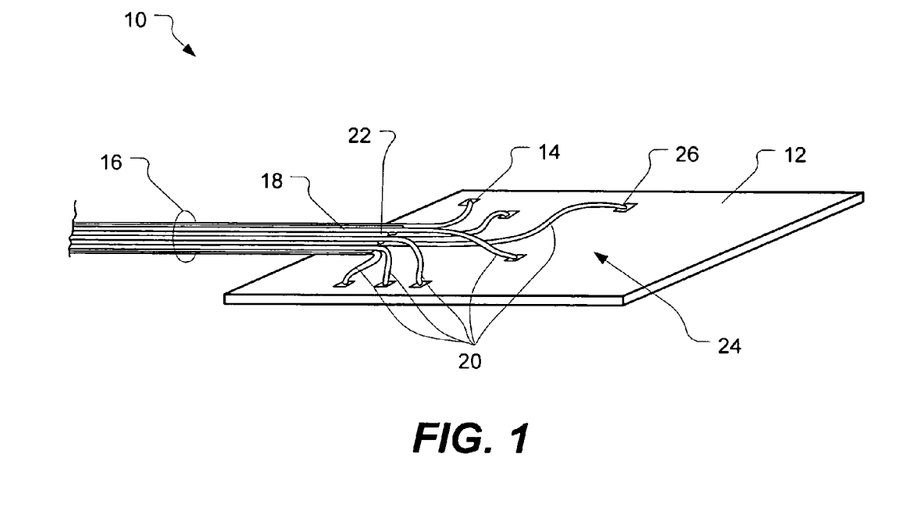
FIG. 1 illustrates a perspective view of a microelectronic circuit in accordance with an embodiment of the present invention.

With reference to FIG. 1, shown is an illustration of a microelectronic circuit according to a first exemplary embodiment of the present invention. Specifically, FIG. 1 illustrates the microelectronic circuit 10 as including a substrate 12 having microelectronic circuitry disposed thereon, which includes a plurality of bond pads 14. A bundle 16 of microfilaments 18 makes electrical connections to the substrate. The bundle of microfilaments includes a first subset of signal-carrying 20 microfilaments, having electrically-conductive portions extending longitudinally. For example, the electrically-conductive portions can be the microfilament itself, or a conductive strip deposited on the microfilament as described in further detail below. The first ends 26 of the signal-carrying microfilaments are fanned out from the bundle and directly bonded to corresponding bond pads to make electrical connection between the corresponding bond pads and the electrically-conductive portions.

While it is expected that silicon substrates having integrated circuits will be the most common application of the present invention, this is not a limitation. The present invention can equally be applied to other microelectronics types, including for example hybrid microcircuits, other semiconductors (e.g., GaAs), devices on insulating substrates, and printed circuit boards. Furthermore, while the bond pad is illustrated as a flat structure (e.g., for ultrasonic wire bonding), the bond pad can alternately be a plated through hole into which the microfilament is inserted.

Figure 2A:
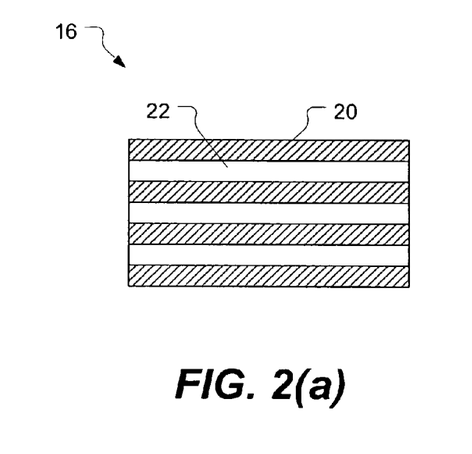
FIG. 2(a) illustrates a side cross-sectional view of bundle of microfilaments in accordance with an embodiment of the present invention.
Figure 2B:
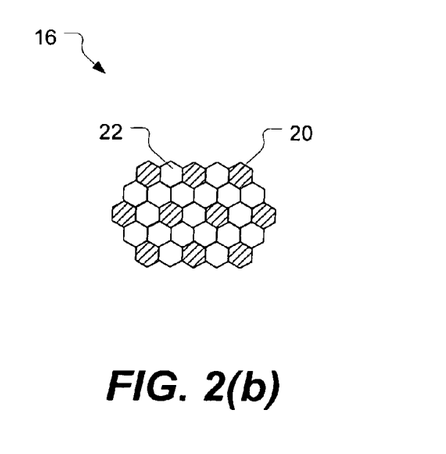
FIG. 2(b) illustrates an end-on cross-sectional view of bundle of microfilaments in accordance with an embodiment of the present invention.

FIGS. 2(a) and 2(b) illustrate a bundle 16 of microfilaments in cross-sectional view in accordance with an embodiment of the present invention. The bundle 16 of microfilaments includes a first subset of signal-carrying 20 microfilaments that are conductive, allowing them to carry an electronic signal. A second subset of microfilaments are insulating 22 microfilaments. The insulating microfilaments are positioned between the signal-carrying microfilaments. For example, the signal-carrying microfilaments can be separated from each other by at least one insulating microfilament. In other words, signal-carrying microfilaments are surrounded by insulating microfilaments.

Figure 7:
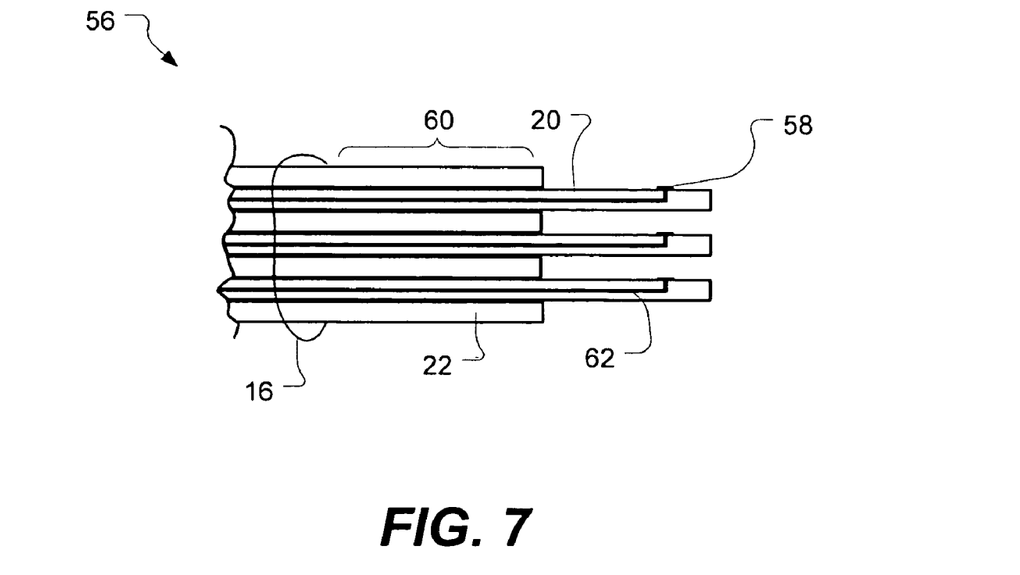
FIG. 7 illustrates a side view of a microfilament bundle having ends formed into a connector in accordance with an embodiment of the present invention.

Although the bundle 16 is shown as a hexagonal close pack arrangement of touching circular cross section microfilaments, many other arrangements and microfilament topologies can be used. The microfilaments can be arranged linearly in a flat one-dimensional bundle (e.g. as shown in FIG. 7) or a two-dimensional bundle (e.g., as shown in FIGS. 1 & 2). The microfilaments may have a round, oval, triangular, square, rectangular, pentagonal, hexagonal, or other polygonal cross section. Furthermore, the microfilaments need not have a constant cross section, and may have a variable cross section. Moreover, the microfilaments in the bundle need not all have the same cross section or diameter. It will however, be appreciated that the use of substantially constant cross-sectional diameter microfilaments may simplify fabrication. Various types of microfilaments can be used, including metal rods, microwires, insulated microwires, glass fibers, aramid fibers, and the like. Features can be disposed on the surface of the microfilaments, for example using cylindrical lithography, as discussed further below.

One advantage provided by the use of a bundle 16 of microfilaments is that increased flexibility in locating bond pads on the microelectronic circuit substrate 12 can be achieved. For example, some bond pads can be located within an interior portion 24 (FIG. 1) of the substrate. This is in contrast to conventional bond pads that are typically located near the periphery of the substrate to help avoid crossing and short-circuiting of bond wires. In contrast, embodiments of the present invention can help to avoid short-circuiting of electrical connections to different bond pads by inclusion of the insulating portions of the microfilament bundle.

Figure 3:
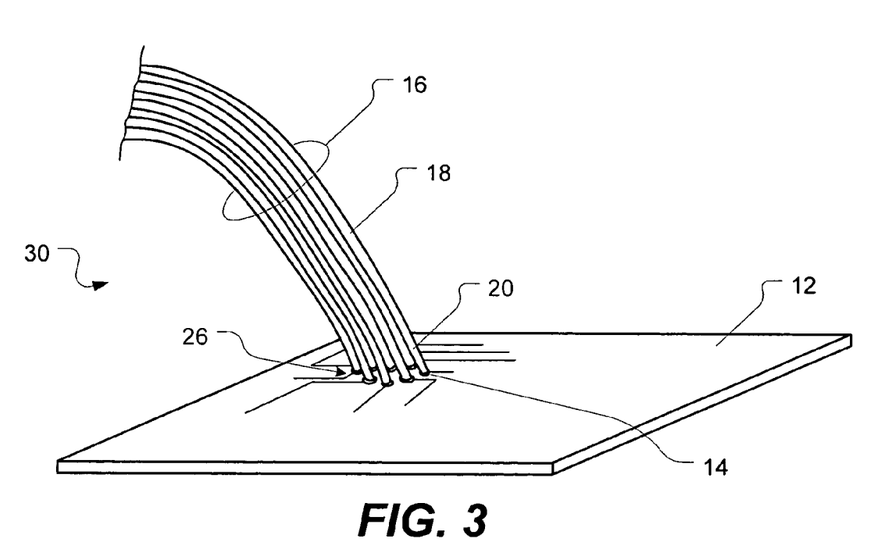
FIG. 3 illustrates a perspective view of a microelectronic circuit according to another exemplary embodiment of the present invention.

An alternate arrangement of a microelectronic circuit is illustrated in perspective view in FIG. 3, in accordance with an embodiment of the present invention. The microelectronic circuit 30 includes a substrate 12 that has a plurality of bond pads 14 disposed substantially adjacent to each other. A bundle of 16 microfilaments is directly bonded to the substrate to form electrical connections between longitudinally-extending conductive portions of signal-carrying microfilaments 20 and corresponding bond pads. For example, ends 26 of the bundle can be differentially positioned with respect to each other to define a three-dimensional interdigitating mating surface which is complementary to the plurality of bond pads, allowing the bundle to simultaneously make multiple electrically connections when bonded to the substrate. Various arrangements of the bond pads can be defined, including for example raised areas, holes, and similar geometric features fabricated on the substrate using lithographic techniques.

Providing multiple interconnections using a bundle 16 of microfilaments as just described can help to provide significant improvements in die area efficiency, since the space used for bond pads can be reduced. By using small diameter microfilaments, e.g. 15 micrometer or less, increased interconnection density can be obtained as compared to conventional bond pads with wire bonding. This can help to reduce the amount of die area that is used for bonding pads. As less semiconductor substrate area is used for bonding pads, more circuitry can be placed within a given volume, or conversely, chip size can be reduced while maintaining the same amount of functionality.

Figure 4:
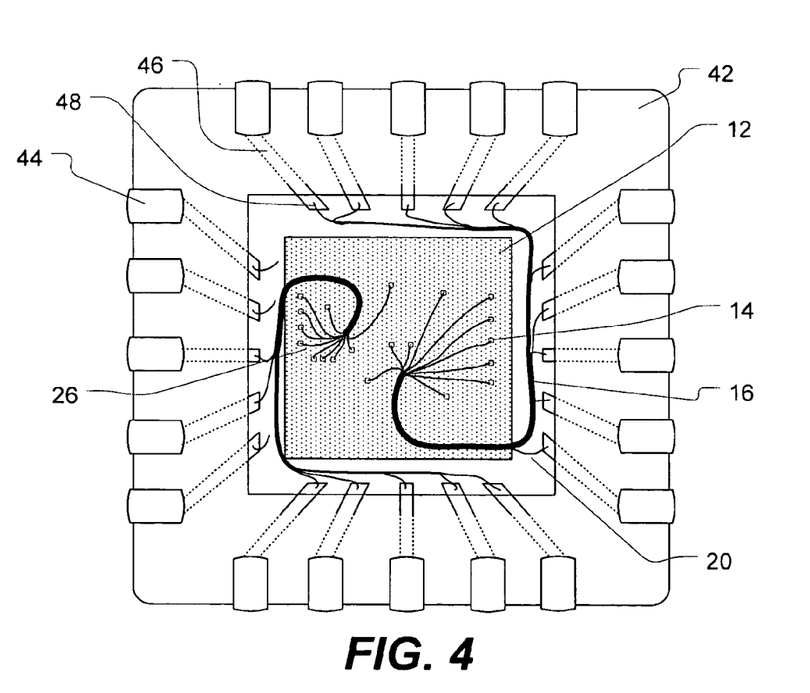
FIG. 4 illustrates a top view of a microelectronic circuit having a microfilament bundle providing connection between bond pads of the microelectronic circuit and lead-connecting portions of a lead frame according to an embodiment of the present invention.

The opposite, second ends of the bundle 16 of microfilaments can be connected in various ways. For example, as illustrated in FIG. 4, in accordance with an embodiment of the present invention, the substrate 12 may be disposed in a package 42 having a lead frame 44 with lead-connecting portions 46. Second ends 48 of the microfilaments can be connected to lead-connecting portions of the lead frame. More than one bundle 16 of microfilaments may be used to make electrical connections between the bond pads 14 and the lead-connecting portions of the lead frame.

Figure 5:
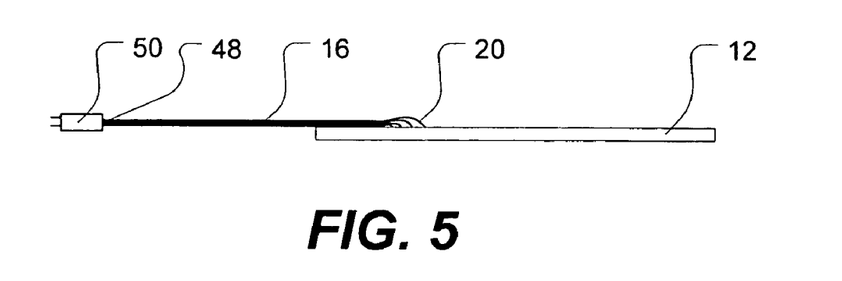
FIG. 5 illustrates a side view of a microelectronic circuit having a microfilament bundle terminated in a connector in accordance with an embodiment of the present invention.
Figure 6:
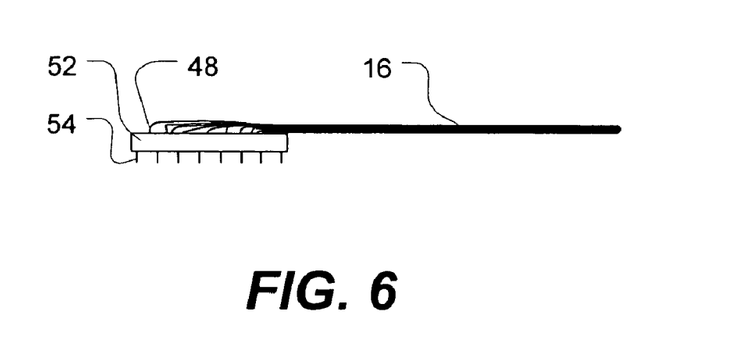
FIG. 6 illustrates a side view of a connector in accordance with an embodiment of the present invention.

As another example, as illustrated in FIG. 5, the second ends 48 of the bundle 16 of microfilaments can be connected to a connector 50. For example, as shown in FIG. 6 a connector can be formed by bonding the second ends to a second substrate that serves as a connector body 52 and houses a plurality of connector pins 54.

Yet another example is illustrated in FIG. 7, where the second ends 48 of the bundle 16 of microfilaments can be formed into a connector 56 as will be described shortly. By bringing the second ends of the bundle to a connector, the need for a lead frame within the package may even be eliminated. Accordingly, an entirely new packaging approach for microelectronic circuits is contemplated. This new packaging approach, exemplified by FIGS. 5-7, has interface to the microelectronic circuit provided by a connector rather than conventional leads on a package. One, or more, microfilament bundles with associated connectors can be included with the microelectronics circuit. Interconnection between different microelectronic circuits is provided by plugging the connectors together, rather than through a conventional printed circuit board. This new approach may potentially reduce the cost and increase reliability of electronic systems.

Describing the connector 56 in further detail, the connector can be formed from the bundle of microfilaments by differentially positioning the second ends of the microfilaments to form a three-dimensional interdigitating mating surface. The signal-carrying filaments 20 include electrically conductive contacts 58 disposed on a side surface of the microfilament to tangentially engage a corresponding electrical contact of a mating connector. Portions 60 of the microfilaments near the mating surface can be fixed together, for example by gluing. Commonly-owned U.S. Pat. No. 7,333,699, entitled "Ultra-High Density Connector", filed the same day as the present application, incorporated herein by reference, describes a variety of microfilament connectors which can be used in embodiments of the present invention.

Figure 8:
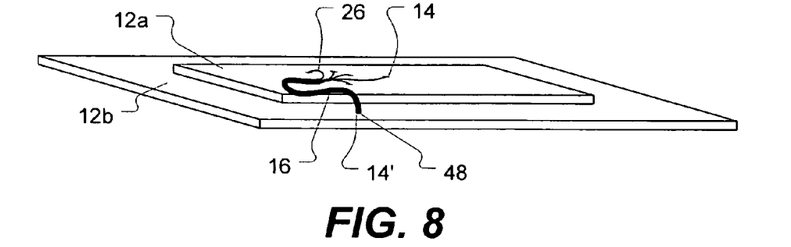
FIG. 8 illustrates stacked microelectronic circuits interconnected by a microfilament bundle in accordance with an embodiment of the present invention.

As yet another example, the second ends 48 of the bundle of microfilaments can be directly bonded to corresponding bond pads of a second substrate. For example, FIG. 8 illustrates stacked microelectronic circuits, where a second substrate 12*a* is placed over a first substrate 12*b*. Electrical connections between the first and second substrates are provided by a bundle 16 of microfilaments, which includes signal-carrying microfilaments. First ends 26 of the signal-carrying microfilaments are directly bonded to corresponding first bond pads 14 on the first substrate and second ends 48 are directly bonded to corresponding second bond pads 14' on the second substrate. The bond pads on either one of the substrates can be distributed over the surface of the substrate (e.g., as shown for the first substrate and described above for FIG. 1) or can be located substantially adjacent to each other (e.g., as shown for the second substrate and described above for FIG. 3).

Figure 9:
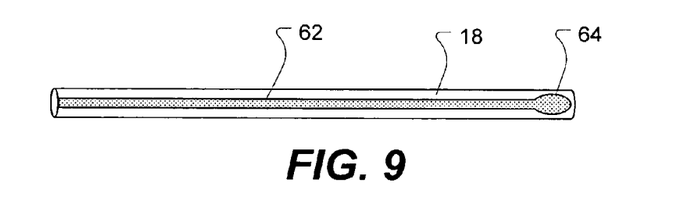
FIG. 9 illustrates a side perspective view of a microfilament having a longitudinally-extending electrically-conductive portion in accordance with an embodiment of the present invention.
Figure 10:
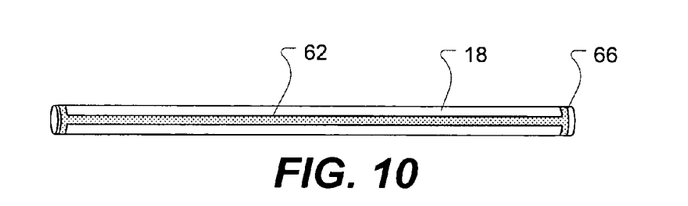
FIG. 10 illustrates a side perspective view of a microfilament having a longitudinally-extending electrically-conductive portion in accordance with another embodiment of the present invention.
Figure 11:
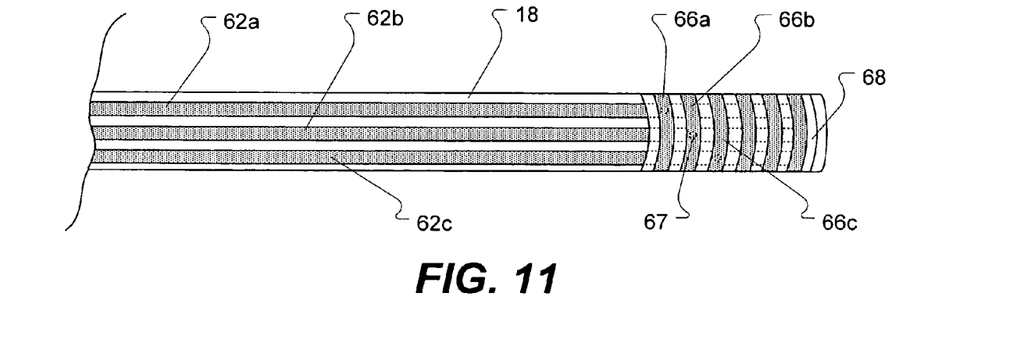
FIG. 11 illustrates a side perspective view of a microfilament having a plurality of longitudinally-extending electrically-conductive portions in accordance with an embodiment of the present invention.

Turning attention to the signal-carrying microfilaments, various ways of providing the longitudinally-extending conductive portions are possible. For example, as discussed above, the microfilament can be a conductive material, such as a microwire or metal rod. Alternately, the microfilament can be a non-conductive elongate substrate on which a conductive portion is deposited. For example, FIG. 9 illustrates a microfilament 18 on which a conductive portion 62 is deposited. The conductive portion may include an extended area 64 near the end of the microfilament to aid in making electrical connection to a bond pad or connector, or to serve as the mating surface of a connector. FIG. 10 illustrates another microfilament on which a conductive portion is deposited. The ends of the conductive portion include circumferential rings 66 to aid in making electrical connection. A microfilament may include a plurality of electrically conductive portion 62*a*, 62*b*, 62*c* as illustrated in FIG. 11. Deposition of conductive portions on the microfilament can be accomplished, for example, using cylindrical lithography. A cylindrical lithography technique is described in commonly-owned U.S. Pat. Nos. 5,106,455; 5,269,882; and 5,273,622 to Jacobsen et al., incorporated herein by reference.

For example, each electrically conductive portion 62*a*, 62*b*, 62*c* can include a corresponding circumferential ring 66*a*, 66*b*, 66*c*. The electrically conductive portions can be deposited on the surface of the microfilament 18. Insulating material 68 can be overlaid on the electrically conductive portions, at least at the end of the microfilament where the circumferential rings are to be positioned. A series of holes 67 is defined in the insulating material over locations in the electrically conductive portions corresponding to where the circumferential rings will be positioned, for example by masking or etching the insulating material. The circumferential rings are deposited over the insulating material, making connection through the series of holes to the corresponding longitudinally extending portions.

Figure 12:
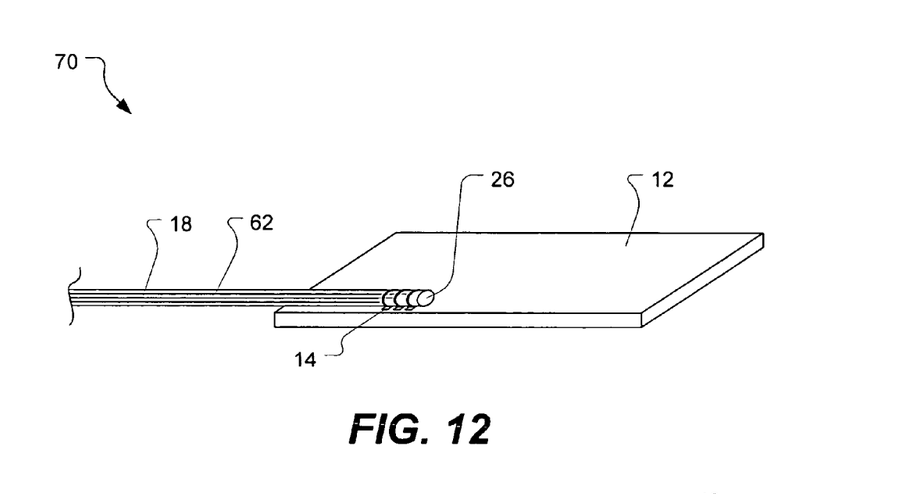
FIG. 12 illustrates a perspective view of a microelectronic circuit in accordance with another embodiment of the present invention.

Using a microfilament with multiple electrically conductive portions as just described can allow for even further density increases in interconnection as will now be explained. FIG. 12 illustrates a microelectronic circuit in accordance with another embodiment of the present invention. The microelectronic circuit 70 includes a substrate 12 having microelectronic circuitry disposed thereon and a plurality of bond pads 14. Directly bonded to the substrate is a microfilament 18 having a plurality of longitudinally-extending electrically-conductive portions 62. The microfilament is laterally positioned so that the side of microfilament makes contact with the substrate, and at least one of the longitudinally-extending electrically-conductive portions makes electrically contact to a corresponding bond pad near the end 26 of the microfilament. Each of the conductive portions may make electrical connection to a corresponding bond pad. Because a single microfilament provides multiple electronic connections, very high connection density on the substrate 12 can be provided. Efficient manufacturing may be provided since bonding a single microfilament can make multiple electrical connections.

Figure 13:
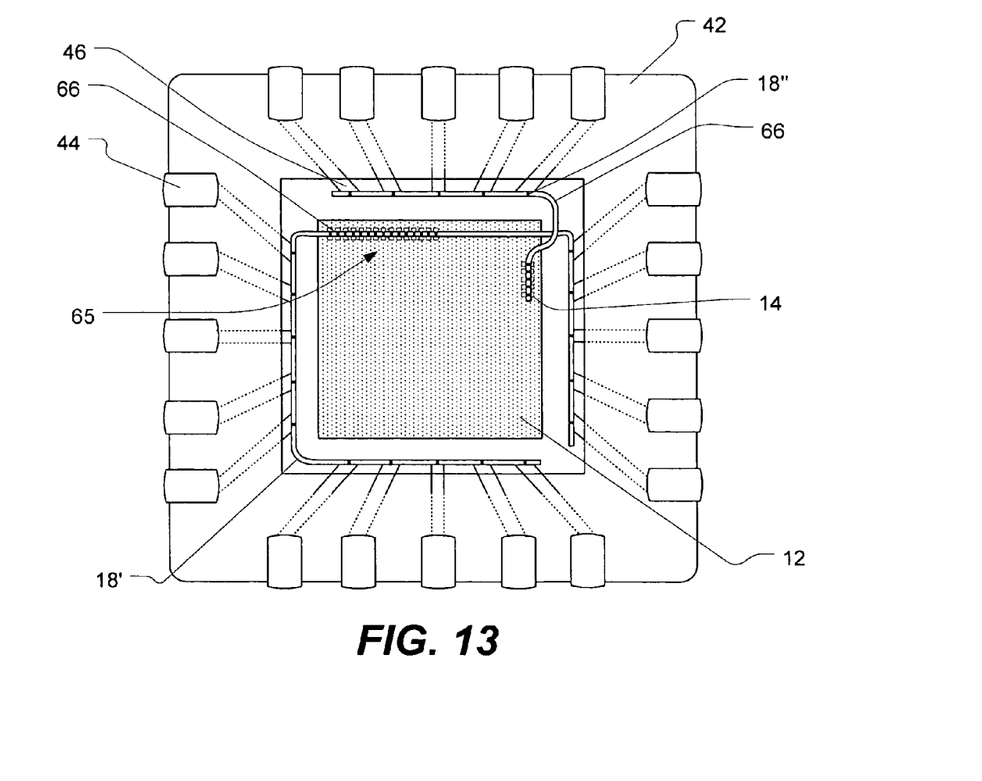
FIG. 13 illustrates a top view of a microelectronic circuit having a microfilament with multiple longitudinally-extending conductive portions providing connection between bond pads of the microelectronic circuit and lead-connecting portions of a lead frame according to an embodiment of the present invention.

A single microfilament with multiple electrically conductive portions can also be used to connect a packaged microcircuit, for example as illustrated in FIG. 13. The microcircuit substrate 12 is placed into a package 42 having a lead frame 44. The microfilament 18' can be bonded to the substrate 12 at a portion at a midway portion 65 (away from the ends) to make electrical connections between the longitudinally-extending electrically-conductive portions (e.g. using conductive rings 66 as described above). Portions of the microfilament extending from the midway portion can make connections to lead-connecting portions 46 of the lead frame (e.g. using widely spaced conductive rings positioned along the length of the microfilament). Alternately, a microfilament 18" can be connected to the substrate near one end, and connections to the lead connecting portions provided along the length the microfilament (e.g. using conductive rings).

Multiple microfilaments, each having a plurality of longitudinally-extending electrically-conductive portions, can be formed into a bundle and directly bonded to the substrate using the techniques described above. The microfilaments can be arranged to avoid electrical shorts between electrically-conductive portions of adjacent signal-carrying microfilaments. Alternately, insulating microfilaments can be included between the signal-carrying microfilaments as described above. A bundle of microfilaments as just described can provide an extremely high-density interconnection.

Figure 14:
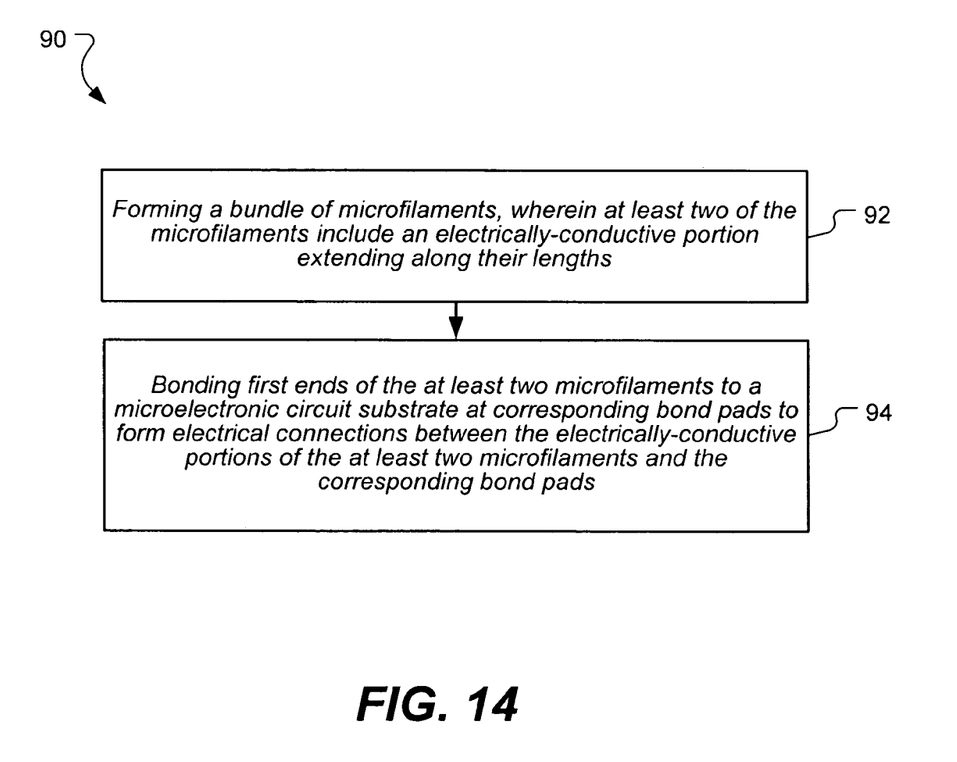
FIG. 14 illustrates a flow chart of a method of electrical interconnection for microelectronic circuits in accordance with an embodiment of the present invention.

Finally, a method for electrical interconnection for microelectronics is shown in flow diagram form in FIG. 14 in accordance with another embodiment of the present invention. The method, shown generally at 90, includes forming 92 a bundle of microfilaments, wherein at least two of the microfilaments include an electrically-conductive portion extending along their length.

Various ways of forming the bundle of microfilaments are possible. For example, the elongate cylindrical elements can be cut from a spool having a long, continuous microfilament. As another example, the elongate cylindrical elements can be glass fibers draw or extruded from a blank or preform. The microfilaments can be placed into a trough, and portions fixed together, for example with glue. Ends of the microfilaments may be positioned in a desired arrangement using stops located at the end of the trough. For example, the bundle may be stacked up by placing a first microfilament in a manufacturing jig, and then adding microfilaments on top of or along side of previously placed elongate cylindrical elements and sliding the microfilaments along until a stop in the manufacturing jig is reached. The manufacturing jig can thus help to define a three-dimensional interdigitating mating surface (for a connector) or define lengths for fanned out portions of the end of the bundle (for bonding to a substrate).

The method also includes bonding 94 the at least two microfilaments having electrically-conductive portions to a microelectronic circuit substrate at corresponding bond pad locations to form electrical connections between the electrically-conductive portions and the corresponding bond pads. This bonding can be performed, for example, by ultrasonic welding, soldering, gluing with conductive epoxy, diffusion bonding, and similar techniques. For example, solder can be placed on the bond pad, the microfilament, or both, and bonding performed by heating the joint to bond the two together. The microfilament can be positioned either end on to the substrate (e.g., as in FIG. 1) or laterally (e.g., as in FIG. 12). As another example, connection can be made away from the end of the microfilament, e.g. in the middle.

The method may also include connecting a second end of the at least two microfilaments to a second electronic component, for example, a second microelectronic circuit substrate or a connector, as described above.

The method may also include forming a connector at second ends of the bundle. For example, the second ends may be positioned differentially with respect to each other to define a three-dimensional interdigitating mating surface as described above. When forming the connector, it is helpful to fix together a portion of the microfilaments near the second ends to provide structural integrity to the connector. A mating connector can be made from microfilaments using similar techniques. Because of the very small size possible with connectors made from microfilaments, plugging together a pair of mating connectors may be facilitated by the use of a mating fixture. The method may also include plugging the connector into a second microfilament bundle having a compatible (e.g., mating) connector.

Summarizing and reiterating to some extent, it will now be appreciated that embodiments of the present invention provide improved density for electrical connections to a microelectronic circuit substrate. Yield problems observed in conventional wire bonded integrated circuit die caused by crossed or shorted bond wires can be avoided by using a bundle of microfilaments to provide connection between the substrate and package lead frame. Connections between substrates in a single package can be provided by microfilament bundles, providing improvements in interconnect density. Problems caused by shorted and broken bond wires may be reduced by the use of a microfilament bundle, providing an increased reliability. New techniques for interconnecting substrates, such as using a mateable connector may avoid the need for lead frames entirely. A variety of other arrangements for interconnection will also become apparent from the above teachings.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

More specifically, while illustrative exemplary embodiments of the invention have been described herein, the present invention is not limited to these embodiments, but includes any and all embodiments having modifications, omissions, combinations (e.g., of aspects across various embodiments), adaptations and/or alterations as would be appreciated by those in the art based on the foregoing detailed description. The limitations in the claims are to be interpreted broadly based the language employed in the claims and not limited to examples described in the foregoing detailed description or during the prosecution of the application, which examples are to be construed as non-exclusive. For example, in the present disclosure, the term "preferably" is non-exclusive where it is intended to mean "preferably, but not limited to." Any steps recited in any method or process claims may be executed in any order and are not limited to the order presented in the claims. Means-plus-function or step-plus-function limitations will only be employed where for a specific claim limitation all of the following conditions are present: a) "means for" or "step for" is expressly recited in that limitation; b) a corresponding function is expressly recited in that limitation; and c) structure, material or acts that support that function are described within the specification. Accordingly, the scope of the invention should be determined solely by the appended claims and their legal equivalents, rather than by the descriptions and examples given above.

What is claimed is:

1. A method of electrical interconnection for a microelectronic circuit having a substrate with bond pads for electronic connection to the microelectronic circuit, the method comprising:

forming a bundle of signal-carrying microfilaments and insulating microfilaments, each signal-carrying and insulating microfilament comprising a separate thread-like structure, wherein at least two of the microfilaments are signal-carrying microfilaments having an electrically-conductive portion extending along their lengths; and bonding the at least two signal-carrying microfilaments to the microelectronic circuit substrate at corresponding bond pads to form electrical connections between the electrically-conductive portions of the at least two signal-carrying microfilaments and the corresponding bond pads.

2. The method of claim 1 further comprising positioning the at least two microfilaments to make contact between a side surface of the microfilament and the microelectronic circuit substrate.

3. The method of claim 1 further comprising connecting the at least two microfilaments to a second electronic component.

4. The method of claim 1 further comprising forming a connector at an end of the bundle.

5. The method of claim 4 wherein forming a connector comprises:
positioning ends of the microfilaments differentially with respect to each other to define a three-dimensional interdigitating mating surface at the end of the bundle; and
fixing together a portion of the microfilaments near the end of the bundle to form the connector.

6. The method of claim 5 further comprising mating the connector to a second bundle of microfilaments having a compatible connector.

7. The method of claim 1 wherein forming a bundle of microfilaments comprises placing the microfilaments so that each microfilament is touching at least one adjacent microfilament 8. The method of claim 1 wherein forming a bundle of microfilaments comprises surrounding each of the at least two microfilaments having an electrically-conductive portion by a plurality of insulating microfilaments.

9. The method of claim 1 wherein forming a bundle of microfilaments comprises depositing the electrically-conductive portions on outer surfaces of the at least two microfilaments.

10. The method of claim 1, further comprising spreading the at least two signal-carrying microfilaments apart from each other prior to bonding to the microelectronic circuit substrate at corresponding bond pads.

11. A microelectronic circuit comprising:
a substrate having microelectronic circuitry disposed thereon, the microelectronic circuitry including a plurality of bond pads;
a bundle of signal-carrying microfilaments and insulating microfilaments, each signal-carrying and insulating microfilament comprising a separate thread-like structure, and wherein at least a first subset of the microfilaments are signal-carrying microfilaments having longitudinally-extending electrically-conductive portions; and
wherein the signal-carrying microfilaments are directly bonded to corresponding bond pads to make electrical connection between the corresponding bond pads and the longitudinally-extending electrically-conductive portions of the signal-carrying micro filaments.

12. The microelectronic circuit of claim 11 wherein a first end of the signal-carrying microfilaments are bonded to the substrate.

13. The microelectronic circuit of claim 11 wherein a second subset of the micro filaments are insulating microfilaments.

14. The microelectronic circuit of claim 12 wherein the signal-carrying microfilaments are separated from each other by at least one insulating microfilament.

15. The microelectronic circuit of claim 11 wherein the longitudinally-extending electrically-conductive portion includes a circumferential ring disposed near an end of the microfilament.

16. The microelectronic circuit of claim 11 wherein at least one of the plurality of bond pads is disposed within an interior portion of the substrate.

17. The microelectronic circuit of claim 11 further comprising:
a package having a lead frame with lead-connecting portions, wherein the substrate is disposed within the package; and
wherein the signal-carrying microfilaments are bonded to corresponding lead-connecting portions of the lead frame to make electrical connection between the longitudinally-extending electrically-conductive portions of the signal-carrying microfilaments and the lead-connecting portions of the lead frame.

18. The microelectronic circuit of claim 11 wherein second ends of the bundle of microfilaments are formed into a connector.

19. The microelectronic circuit of claim 18 wherein the second ends of the bundle are disposed differentially with respect to each other to define a three-dimensional interdigitating mating surface.

20. The microelectronic circuit of claim 11 further comprising:
a second substrate having microelectronic circuitry disposed thereon, the microelectronic circuitry including a plurality of second bond pads; and
wherein the signal-carrying microfilaments are directly bonded to corresponding second bond pads to make electrical connection between the longitudinally-extending electrically-conductive portions and the corresponding second bond pads.

21. The microelectronic circuit of claim 11 wherein at least one of the signal-carrying microfilaments includes a plurality of longitudinally-extending electrically-conductive portions, and wherein the at least one signal-carrying microfilament makes electrical connection between the plurality of longitudinally-extending electrically-conductive portions and a corresponding plurality of the bond pads.

22. The microelectronic circuit of claim 11 wherein the substrate is a silicon substrate.

23. The microelectronic circuit of claim 11 wherein the substrate is a printed circuit board.

24. The microelectronic circuit of claim 11 wherein the bond pad is a plated through hole.

25. The microelectronic circuit of claim 11, wherein the microfilaments have a cross section chosen from the group of shapes consisting of round, oval, triangular, square, rectangular, pentagonal, hexagonal, and polygonal.

26. The microelectronic circuit of claim 11, wherein the microfilaments are chosen from the group of filamentary structures consisting of a microwire, an insulated microwire, and a glass fiber.

27. The microelectronic circuit of claim 11, wherein the microfilaments have a cross-sectional diameter of less than 15 micrometer.

28. The microelectronic circuit of claim 11, wherein the microfilaments are all substantially equal in cross section dimension.

29. A microelectronic circuit comprising:
a substrate having microelectronic circuitry disposed thereon, the microelectronic circuitry including a plurality of bond pads; and
at least one microfilament comprising a thread-like structure, and having a plurality of longitudinally-extending electrically-conductive portions formed on the surface thereof and in electrical communication with a plurality of respective electrically-conductive interface elements supported about the microfilament, a side of the microfilament being directly bonded to the substrate so that at least one of the plurality of interface elements makes electrical contact to a corresponding bond pad.

30. The microelectronic circuit of claim 29, wherein each of the plurality of longitudinally-extending electrically-conductive portions makes electrical contact to a corresponding bond pad.

31. The microelectronic circuit of claim 29, wherein each of the plurality of longitudinally-extending electrically-conductive portions comprises an electrically-conductive ring disposed circumferentially around the at least one microfilament.

32. The microelectronic circuit of claim 29, further comprising a connector wherein a second end of the microfilament is coupled to the connector.

33. The microelectronic circuit of claim 29, further comprising:
 a second substrate having microelectronic circuitry disposed thereon, the microelectronic circuitry including a plurality of second bond pads; and
 wherein the microfilament is directly bonded to the second substrate near a second end of the microfilament so that at least one of the plurality of longitudinally-extending electrically-conductive portions makes electrical contact to a corresponding second bond pad.

* * * * *